United States Patent [19]

Hatakeyama et al.

[11] Patent Number: 5,677,011
[45] Date of Patent: Oct. 14, 1997

[54] PROCESSING METHOD USING FAST ATOM BEAM

[75] Inventors: Masahiro Hatakeyama, Fujisawa; Chikako Takatou, Sagamihara, both of Japan

[73] Assignee: Ebara Corporation, Tokyo, Japan

[21] Appl. No.: 691,366

[22] Filed: Aug. 2, 1996

[30] Foreign Application Priority Data

Aug. 2, 1995 [JP] Japan .................................. 7-216705

[51] Int. Cl.⁶ .................................................. C08J 7/06
[52] U.S. Cl. ...................... 427/497; 427/248.1; 427/259; 427/282; 427/402; 427/504; 427/523; 427/526; 427/585; 427/595
[58] Field of Search ........................ 427/497, 504, 427/526, 523, 585, 595, 248.1, 259, 282, 402

[56] References Cited

PUBLICATIONS

Tetsuro Nakamura et al., "Fabrication Technology of Integrated Circuit", published by Sangyo Tosho Publishing Company (Japan), 1987, pp. 21–23 (no month avail.).

Fusao Shimokawa et al., "Reactive–fast–atom beam etching of GaAs using $Cl_2$ gas", J. Appl. Phys. 66(6), 15 Sep. 1989, published by 1989 American Institute of Physics, 1989, pp. 2613–2618.

Primary Examiner—Bernard Pianalto
Attorney, Agent, or Firm—Wenderoth, Lind & Ponack

[57] ABSTRACT

There are disclosed a processing method and a processing apparatus using a fast atom beam to process a micro-sized structure on a desired face and portion of a workpiece having a complex shape. In this invention, an electron beam and/or a focused ion beam is applied to a surface of a workpiece to produce a masking film layer on the workpiece. After that, a fast atom beam is applied to the workpiece remove the surface layer of the workpiece where the masking film layer is not formed.

5 Claims, 7 Drawing Sheets

PROCESSING METHOD USING FAST ATOM BEAM

BACKGROUND OF THE INVENTION

1. Field of the Invention

The present invention relates to a processing method and a processing apparatus using a fast atom beam suitable for processing, for example, ultra-fine microstructures on a desired face or portion of a workpiece having a complex shape.

2. Description of the Related Art

Conventional semiconductor device fabrication has been carried out with the use of photolithography as illustrated in FIG. 7. In such a method, those regions of a substrate which are not to be fabricated are covered with a photomask, and the unprotected regions are exposed to an ultra-violet beam for photographic development, or energized ions in the case of plasma processing. The depth of fabrication is controlled by adjusting the time of material etching.

Figure 7A:
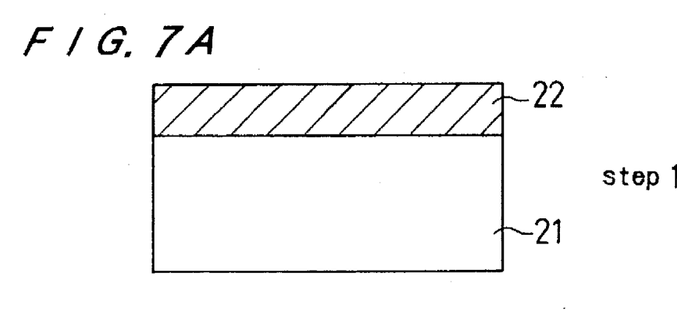
FIGS. 7A, 7B, 7C, 7D and 7E are schematic illustration showing a conventional processing method.
Figure 7B:
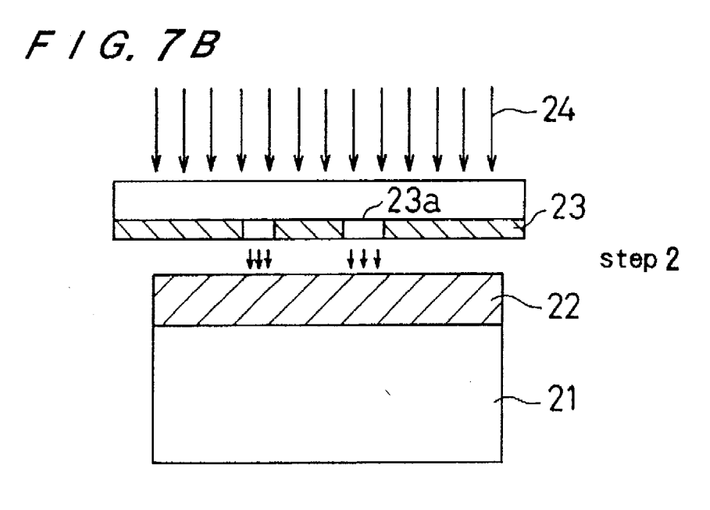
Figure 7C:
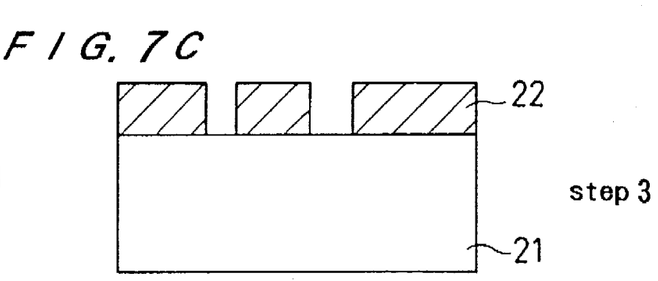

More detailed explanation of photolithographic method will be given below. In step 1, a photoresist material 22 is applied as a coating on the fabrication surface of a substrate 21. In step 2, a photomask 23 is placed on the target surface which is irradiated with an ultra-violet beam 24, thereby transferring the device pattern 23a formed on the photomask 23 onto the photoresist 22. In step 3, the device pattern 23a is photographically developed to remove the photoresist 22 from the UV-exposed regions of the device pattern 23a so that the fabrication surface of the substrate 21 will be exposed.

Figure 7D:
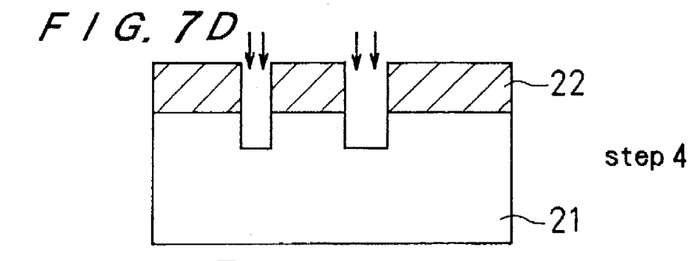
Figure 7E:
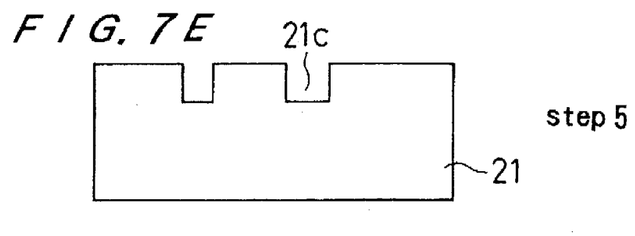

In step 4, selective etching is performed using ions and radicals in a plasma discharge acting on the exposed surface of the base 21, and finally in step 5, the remaining photoresist 22 is removed. By going through the five steps outlined above, the cavities 21c which are identical to the device patterns 23a are formed on the base 21. This basic cycle is repeated to complete the formation of device cavities.

The conventional photolithographic process is capable of forming cavities having a relatively simple and large cross section; however, it is difficult to form a photoresist mask of a pattern having a small dimension, for example, less than 1 μm. It requires a special apparatus and a high production cost to form such a micro-sized pattern by this method. Also, by the above conventional process, it is difficult to process a micro or ultra-fine structure on a desired face or portion of the workpiece, and is almost impossible when it has an intricate shape.

The reason for this stays in that the formation technology of a patterned mask through the photolithographic process is aimed for use on a single and flat surface such as a semiconductor wafer. That is, the use of conventional plasma process makes it difficult to fabricate a vertical wall with precision less than 1 μm because of an oblique incidence of ions onto the workpiece.

SUMMARY OF THE INVENTION

It is therefore an object of the present invention to provide a processing method and a processing apparatus enabling a micro-sized fabrication on a desired face and portion of a workpiece, even when it has a complex shape.

According to a first aspect of the present invention, there is provided a processing method using a fast atom beam comprising a deposition step for forming a patterned masking film layer on a surface of a workpiece by partially irradiating an electron beam and/or a focused ion beam on the surface within a reactant atmosphere, and a processing step for fabricating a patterned microstructure by irradiating a fast atom beam on the surface so as to process the surface layer of the unmasked region of the workpiece.

According to the above invention, in the deposition step, an electron beam and/or a focused ion beam is applied to a surface of a workpiece to form a micro-sized or ultra-micro-sized patterned masking film layer. The masking film layer is formed through an interaction between reactant gas particles existing around the workpiece and the electron beam and/or the focused ion beam. The reactant gas particles are excited by the interaction so as to produce a deposition layer of the gas particles on the surface of the workpiece. The electron beam and/or the ion beam may be deflected by a magnetic field or electric field to form a desired patterned masking film layer.

In the next step, the fast atom beam is applied to the workpiece through the micro-sized or ultra-micro-sized patterned masking film layer formed on the workpiece. Since the fast atom beam is electrically neutral, it can be used in a fabrication of various materials including not only metals and semiconductors but also non-conductive materials. Also, since it is an energized particle beam having a high directivity, an anisotropic fabrication with a high aspect ratio can be facilitated, which is difficult through a plasma process. Thus, a desired face and portion of the workpiece can be processed with a micro-sized or ultra-micro-sized pattern even when the workpiece has a complex shape.

It is another advantage of the invention that it can form an additional pattern in the second step by using another patterned mask. The mask may be arranged between the fast atom beam source and the surface of the workpiece to be processed for limiting the irradiation region.

The present invention thus makes it possible to provide a quantum effect element, a laser element utilizing a quantum effect, a light emitting element and an optical lens element, which have a structure and function which cannot be achieved through a conventional process. Also, the present invention makes it possible to produce a friction releasing mechanism. Thus, in various devices such as an optical-magnetic disc head, magnetic tape head, rotation-thrust bearing mechanism, fluid seal mechanism, the performance is improved and the size is reduced. Therefore, the present invention has large industrial applicability.

In another aspect of the invention, the deposition step may be conducted in an atmosphere including an introduced reactant gas. According to the invention, the material of the masking film layer can be selected by intentionally introducing a reactant gas including components to be deposited on the workpiece. The gas interacts with a electron beam and/or ion beam to form the patterned masking film layer. For example, when a metal layer is preferable, a gas including metal components is introduced into the chamber.

In another aspect of the invention, a plurality of faces of the workpiece are processed by irradiating beams on each faces simultaneously or sequentially in the deposition and/or processing steps. This can be achieved by shifting and rotating the workpiece by moving means to direct those faces to the irradiating means, or by using a plurality of irradiation means enabling a simultaneous irradiation of a plurality of faces.

In another aspect of the invention, a position and/or an attitude of the workpiece is controlled during the irradiation in the deposition step. According to the invention, a beam is scanned across a workpiece to facilitate a formation of a masking film having a more complex pattern.

In another aspect of the invention, a position and/or an attitude of the workpiece is controlled during the irradiation in the processing step. According to the invention, an irradiating direction of the fast atom beam and an irradiating portion can be controlled in the step to create a more complex structure. In addition to that, by controlling the irradiation time, three-dimensional processing of a desired pattern and depth can be provided.

According to another aspect of the present invention, there is provided a processing apparatus using a fast atom beam comprising at least one air-tight vessel for retaining a workpiece in a predetermined atmosphere, first beam irradiating means for partially irradiating an electron beam and/or a focused ion beam on a surface of the workpiece, and second beam irradiating means for irradiating a fast atom beam on a surface of the workpiece.

In another aspect of the invention, the apparatus may further include gas supplying means for supplying a reactant gas to the vessel.

The invention may further include controlling means for controlling a position and/or an attitude of the workpiece. According to the invention, the micro-sized or ultra-micro-sized patterned layer can be formed on a desired face and portion of the workpiece.

In another aspect of the invention, the controlling means may include a manipulator and/or a shifting table. These devices may adapt a high precision shifting mechanism using a piezoelectric element, which can drive those devices with a high precision within a range of from 1 nm to 100 nm to facilitate fabrication of ultra-micro-sized pattern.

In another aspect of the invention, the apparatus may further include controlling means for controlling a position and/or an attitude of the fast atom beam source.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Hereinafter, preferred embodiments of the present invention will now be described, referring to the accompanying drawings.

Figure 1:
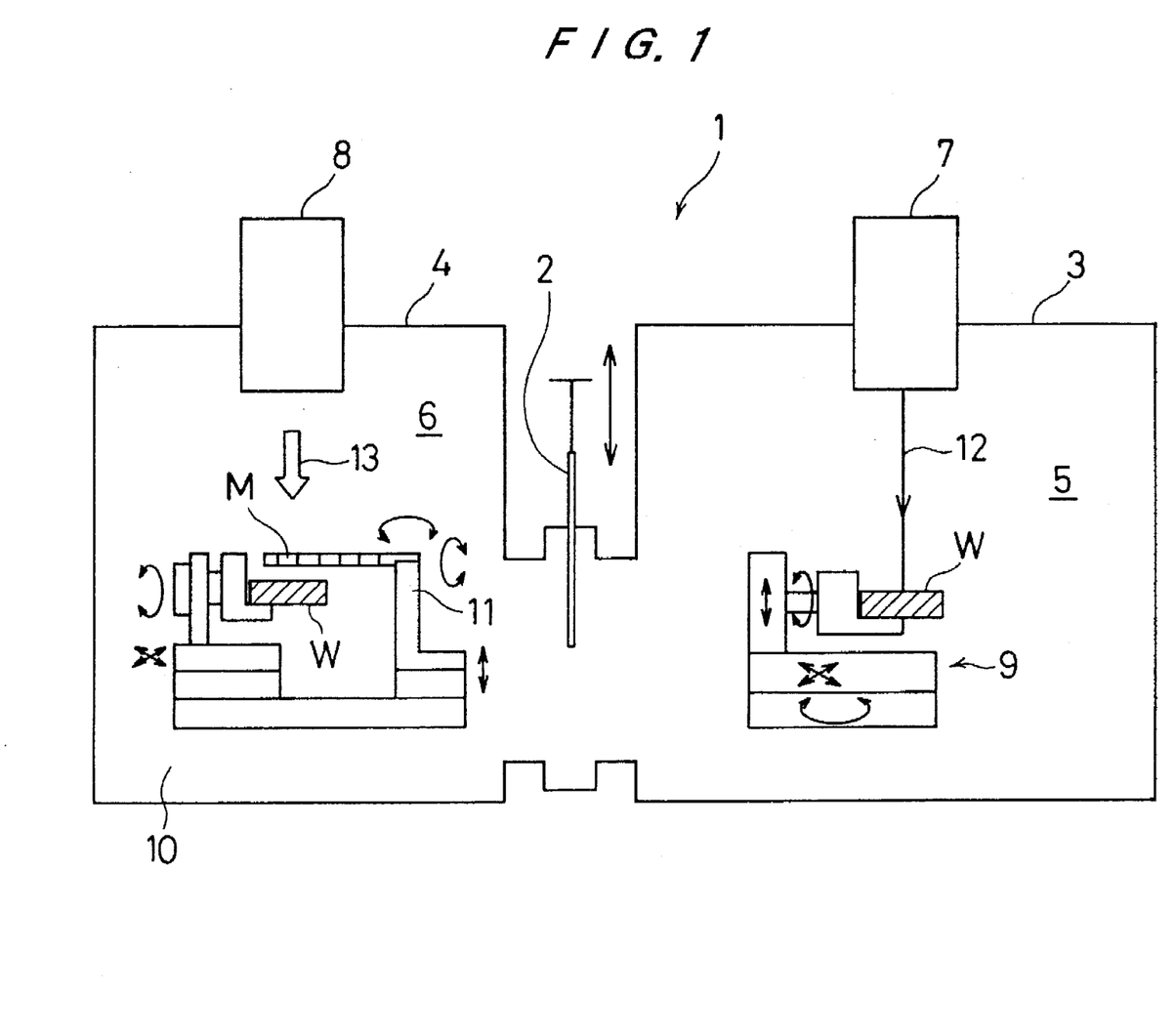
FIG. 1 is a schematic illustration showing a processing apparatus of a first embodiment of the present invention.
Figure 2:
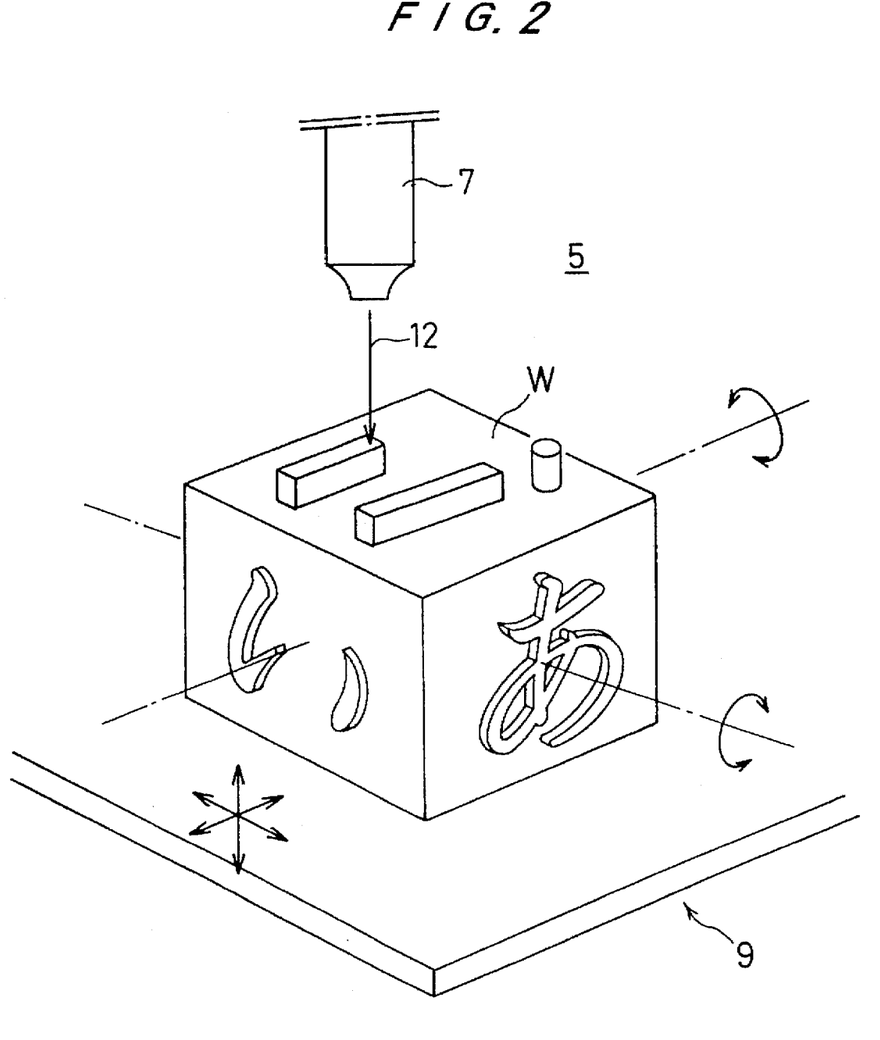
FIG. 2 is a perspective view showing a first step of a processing method of the present invention.
Figure 3:
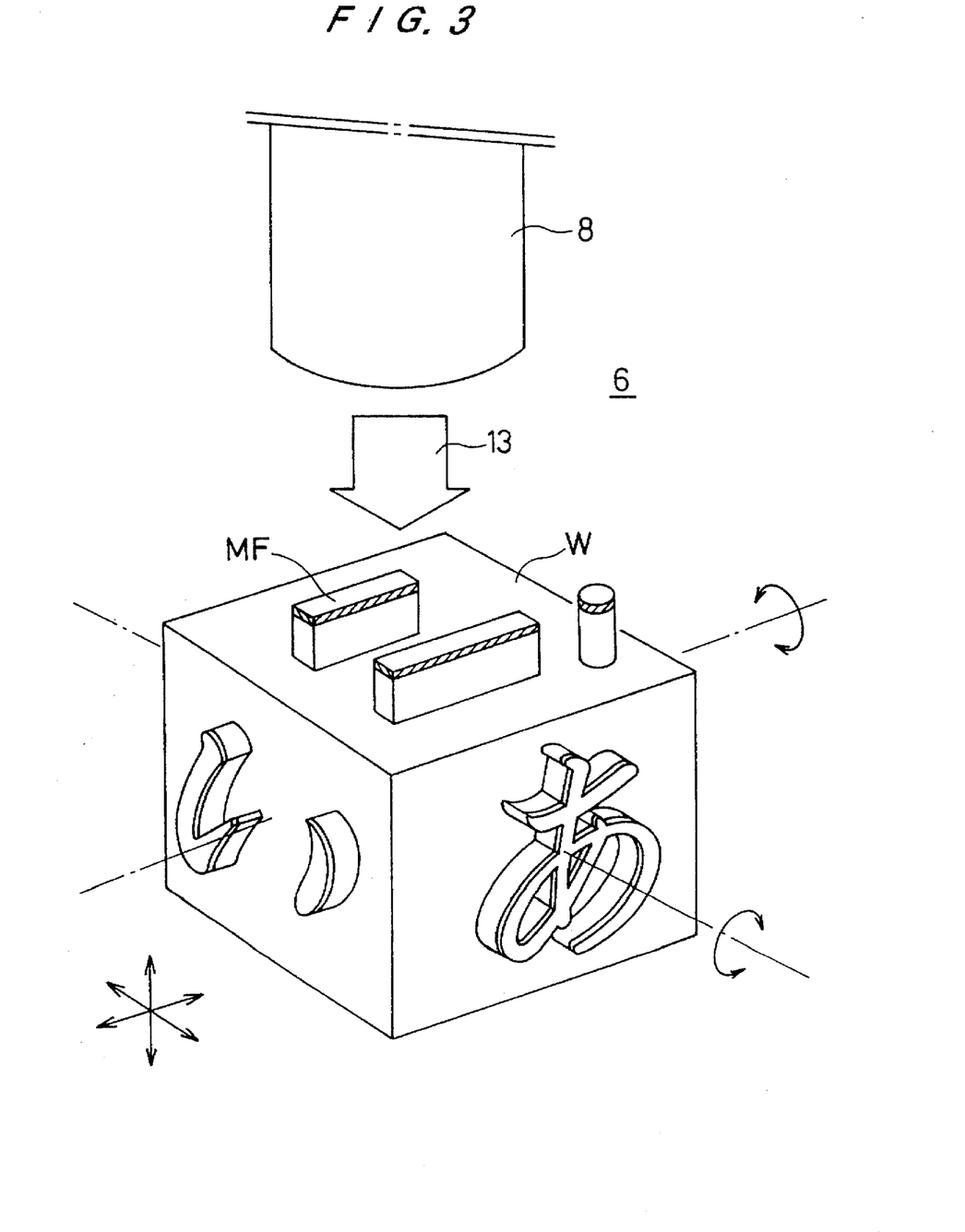
FIG. 3 is a perspective view showing a second step of a processing method of the present invention.

FIGS. 1 through 3 show a first embodiment of a processing apparatus of the present invention. The processing apparatus has two vacuum vessels 3, 4, connected through a gate valve 2. The vacuum vessel 3 defines a deposition chamber 5 therein in which an electron beam source (electron gun) 7 is provided, and the vacuum vessel 4 defines a processing chamber 6 therein in which a fast atom beam source 8 is provided. In both chambers 5, 6, working tables 9, 10 capable of multi-direction translation and multi-axis rotation are provided for holding a workpiece W so as to enable its change in position and attitude. On the working table 10 in the processing chamber 6, a mask holder 11 for holding a mask M movable relative to the workpiece W is provided, which controls the processed area of the workpiece W by partially shielding the irradiation of the fast atom beam. The workpiece W is supplied there by a feeding robot provided with a manipulator and a pallet.

The electron gun 7 emits electron beam 12 having a diameter focused in a range of from 0.1 nm to 100 nm by an electrostatic lens, as shown in FIG. 2. Positioning of the electron beam 12 or controlling of scanning speed thereof is done by controlling the movement of the table 9 in accordance with a pre-installed program so as to obtain a desired pattern on the workpiece W. This makes it possible to scan the electron beam, and therefore, to process a desired pattern on any desired face or portion of the workpiece W. In the region irradiated by the electron beam 12, a masking film layer MF having a thickness corresponding to the electron beam irradiation time, and a width corresponding to a diameter of the beam is provided, thus forming a masking film layer MF having a pattern width ranging from 0.1 nm to 100 nm.

An example of the the electron gun 7 for use with the present invention is the one equipped to a scanning electron microscope. In this case, deposition and etching processes can be observed within the magnified scope of the surface of the workpiece.

In order to conduct deposition by the electron beam 12, both existing impurity gas particles in the vacuum vessel 3 and intentionally introduced deposition reactant gas particles into the chamber can be utilized. When the existing or remaining gas particles are used, a carbon containing film such as graphite film, diamond-like carbon film or a hydrocarbon macromolecule film is formed. In order to deposit a patterned metal film, gases such as, $W(CO)_6$, aluminum chloride or tungsten fluoride are used. Such film layer can be formed through a vapour deposition or sputtering, that is, by positioning the workpiece in the vacuum vessel 3, irradiating electron beam or focused ion beams to a metal material source prepared in the vessel 3 so that a vaporized material atmosphere is generated in the vessel 3 prior to the deposition process.

After the masking film layer MF is produced, the workpiece W is transferred to the processing chamber 6 and is exposed to the irradiation of the fast atom beam 13 emitted from the fast atom beam source 8 by selecting faces or portions to be etched. In the processing chamber 6, it is also possible to use a working table capable of multi-direction translation and multi-axis rotation so as to irradiate fast atom beam 13 on any desired face or portion of the workpiece W. Also, a mask M is usable to obtain a desired shape by controlling it. The processing depth can be controlled by adjusting the intensity and/or the time of the irradiation of the fast atom beam. Any desired process pattern can be introduced on the workpiece by controlling the scanning position and speed of the fast atom beam 13, in the same manner with the deposition chamber 5. It is also possible to use the movable table 10 and the mask holder 11 during the irradiation so as to construct a curved microstructure having three-dimensional convexoconcave on the workpiece. In this embodiment, the deposition chamber 5 and the processing chamber 6 are arranged close to each other, however, it is possible to use a fast atom beam chamber 6 arranged independent of the deposition chamber 5.

Figure 4:
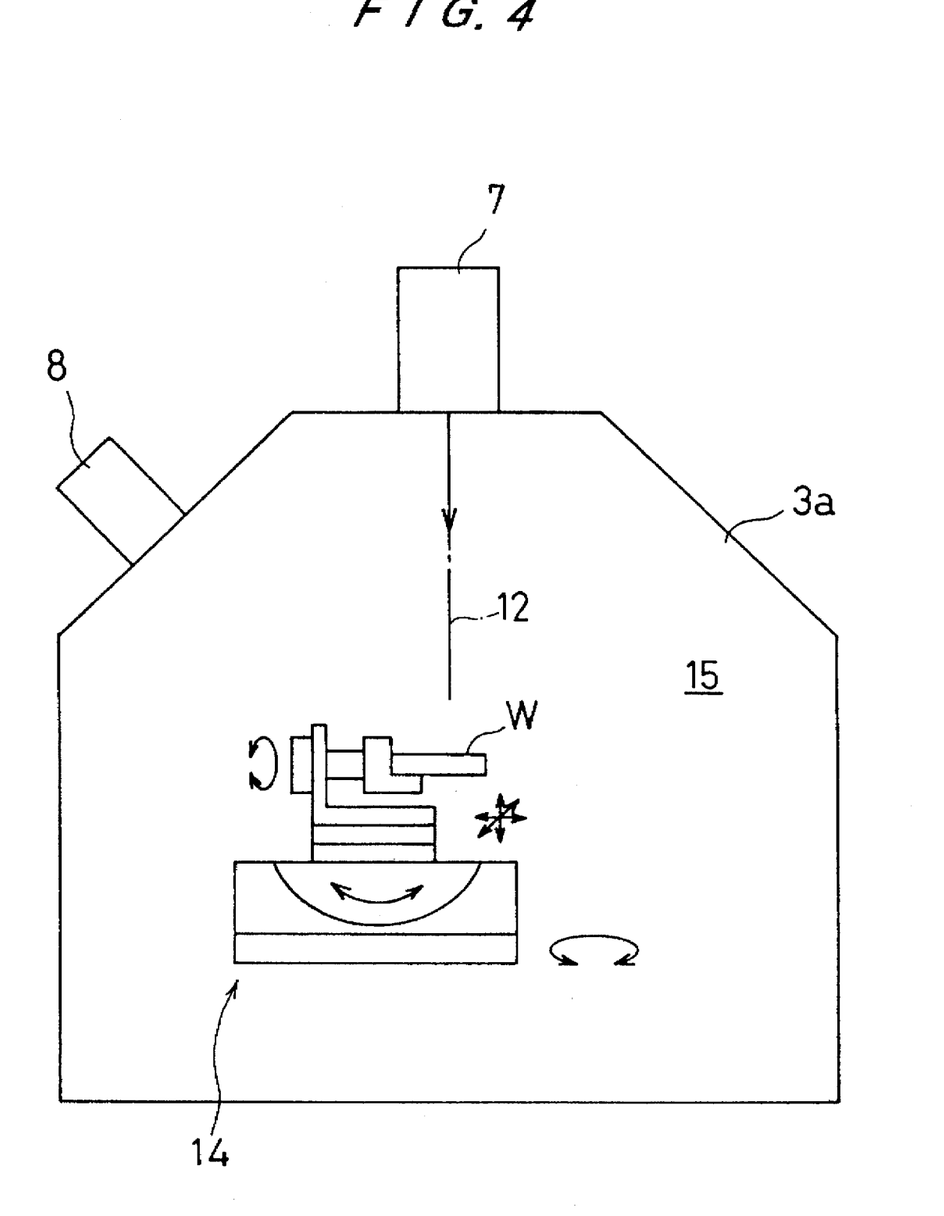
FIG. 4 is a schematic illustration showing a processing apparatus of a second embodiment of the present invention.

FIG. 4 shows a second embodiment of the present invention. In the following description, the same features as those previously described will be denoted by the same reference numerals and the detailed description thereof will be omitted.

In this embodiment, the electron beam source 7 and the fast atom beam source 8 are provided in one vacuum vessel 3a. The table 14 holding the workpiece W has multiple degrees of freedom of movement, therefore, it can be shifted and rotated in the vacuum vessel 3a so that the workpiece W can be positioned to face the desired portion thereof toward the electron source 7 or the fast atom beam source 8. Thus, the electron beam 12 and the fast atom beam 13 can be applied to the desired portion of the workpiece W. According to the processing apparatus of this embodiment, since the pattern deposition step and the pattern processing step are conducted in one chamber, it is not necessary to transfer the workpiece W between chambers while conducting the two steps, and, thus the process is simplified. When the atmosphere in the deposition/processing chamber needs to be changed, a gas-exhausting step and a gas-supplying step are introduced between the two steps.

Figure 5:
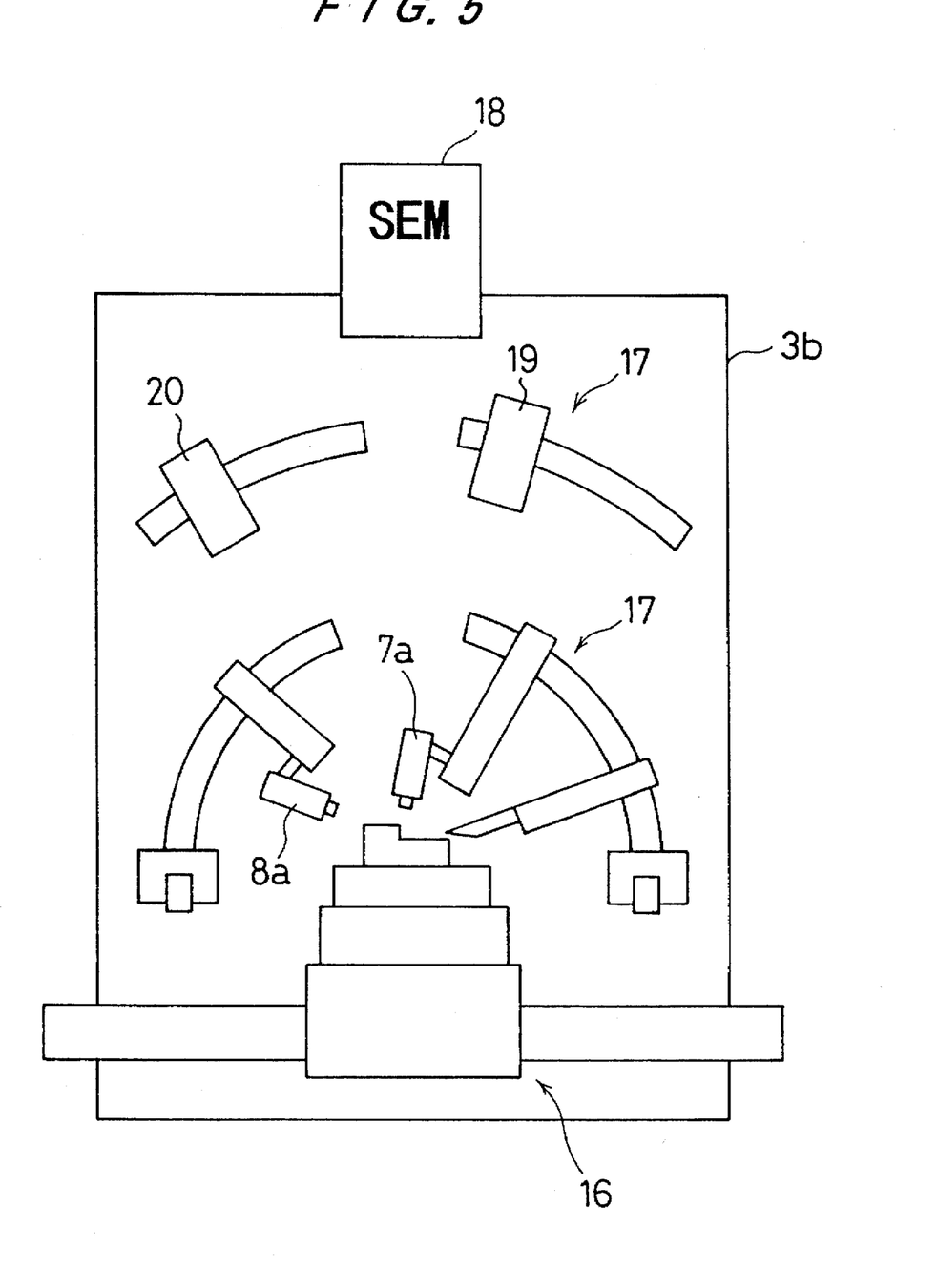
FIG. 5 is a schematic illustration showing a processing apparatus of a third embodiment of the present invention.
Figure 6:
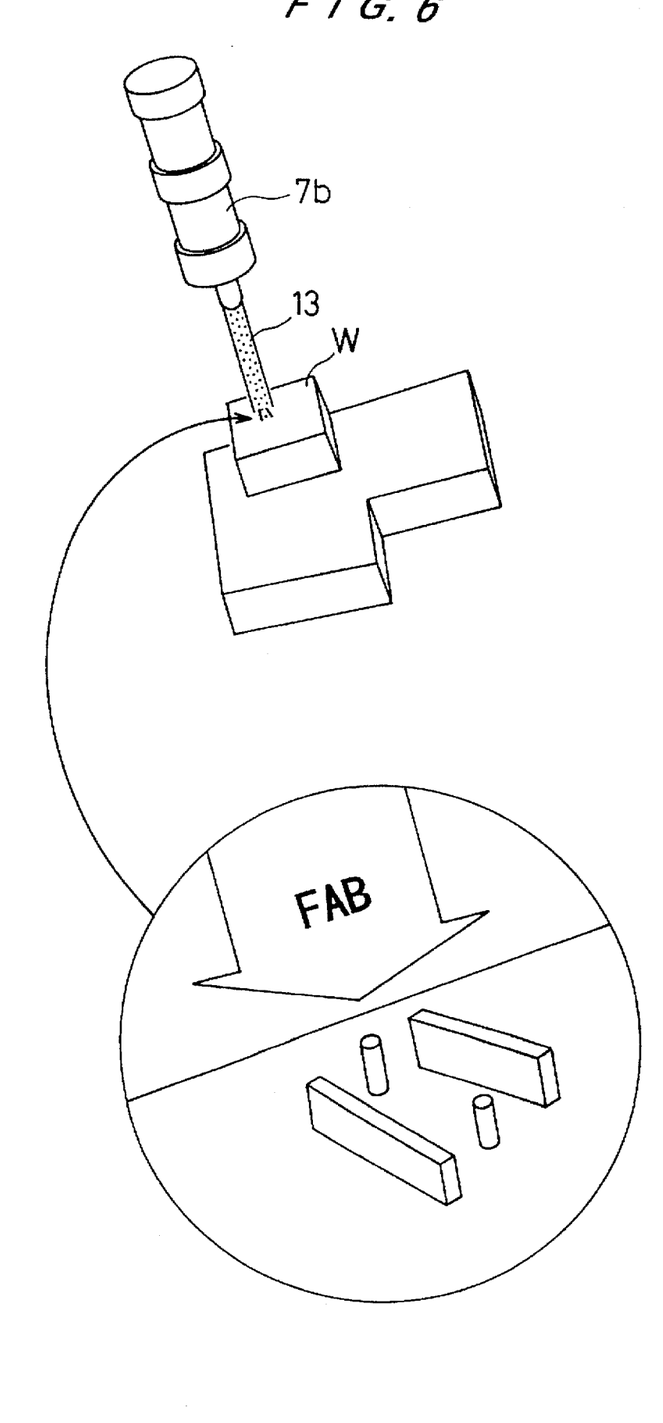
FIG. 6 is a schematic illustration showing a second step of a processing method using the processing apparatus shown in FIG. 5.

FIGS. 5 and 6 show a processing apparatus of a third embodiment of the present invention. In this embodiment also, the electron beam source 7a and the fast atom beam source 8a are provided in one vacuum vessel 3b. The workpiece W is placed on the shifting-rotating table 16 surrounded by a plurality of articulated manipulators 17 carrying a small size electron beam source 7a and a small size fast atom beam source 8a. On the articulated manipulator 17, a magnifying observation apparatus such as a scanning electron microscope 18 or an optical microscope is mounted as well as a laser analyzer 20. A holder for holding a mask M or other necessary apparatus may be equipped to the articulated manipulator 17.

The fast atom beam source 8a is of a small size designed to emit a fast atom beam of a small diameter ranging from 10 nm to 100 µm. In order to provide the fast atom beam having such a beam size, a shielding member having an aperture of a small size may be placed just downstream the fast atom beam discharge port, or, alternatively, a mask member having an aperture may be placed upon the face of the workpiece W to be processed. According to the present embodiment, since the small atomic beam source 8a has a micro beam size to facilitate a partial etching process, it is possible to process a desired small area selected from the exposed surface of the workpiece W.

The remaining masking film layer MF is removed by any appropriate process, when it is necessary.

Although certain preferred embodiments of the present invention have been shown and described in detail, it should be understood that various changes and modifications may be made therein without departing from the scope of the appended claims.

What is claimed is:

1. A processing method using a fast atom beam comprising:

a deposition step for forming a patterned masking film layer on a surface of a workpiece by partially irradiating an electron beam and/or a focused ion beam on the surface within a reactant atmosphere; and a processing step for fabricating a patterned microstructure by irradiating a fast atom beam on the surface so as to process the surface layer of the unmasked region of said workpiece.

2. A processing method using a fast atom beam according to claim 1, wherein said deposition step is conducted in an atmosphere including an introduced reactant gas.

3. A processing method using a fast atom beam according to claim 1, wherein a plurality of faces of said workpiece are processed by irradiating beams on each faces simultaneously or sequentially in said deposition and processing steps respectively.

4. A processing method using a fast atom beam according to claim 1, wherein a position and/or an attitude of said workpiece is controlled during the irradiation in said deposition step.

5. A processing method using a fast atom beam according to claim 1, wherein a position and/or an attitude of said workpiece is controlled during the irradiation in said processing step.

* * * * *